(12) United States Patent
Menut et al.

(10) Patent No.: US 6,897,545 B2
(45) Date of Patent: May 24, 2005

(54) LATERAL OPERATION BIPOLAR TRANSISTOR AND A CORRESPONDING FABRICATION PROCESS

(75) Inventors: Olivier Menut, Grenoble (FR); Herve Jaouen, Meylan (FR)

(73) Assignee: STMicroelectronics S.A., Montrouge (FR)

(*) Notice: Subject to any disclaimer, the term of this patent is extended or adjusted under 35 U.S.C. 154(b) by 37 days.

(21) Appl. No.: 10/142,249

(22) Filed: May 9, 2002

(65) Prior Publication Data

US 2003/0025125 A1 Feb. 6, 2003

(30) Foreign Application Priority Data

May 9, 2001 (FR) .............................. 01 06141

(51) Int. Cl.[7] .......................................... H01L 27/102
(52) U.S. Cl. ..................... 257/575; 257/576; 257/581
(58) Field of Search ................................. 257/575, 576, 257/581; 438/204, 236, 335

(56) References Cited

U.S. PATENT DOCUMENTS

| | | | |
|---|---|---|---|
| 5,316,957 A | | 5/1994 | Spratt et al. |
| 5,422,502 A | * | 6/1995 | Kovacic ..................... 257/197 |
| 5,494,837 A | | 2/1996 | Subramanian et al. |
| 5,496,745 A | | 3/1996 | Ryum et al. |
| 5,786,258 A | | 7/1998 | Miwa et al. |
| 5,994,162 A | * | 11/1999 | Burghartz et al. ............ 438/57 |
| 6,030,864 A | * | 2/2000 | Appel et al. ................ 438/234 |
| 6,730,986 B2 | * | 5/2004 | Park ........................... 257/587 |
| 2003/0059985 A1 | * | 3/2003 | Adkisson et al. ........... 438/149 |

FOREIGN PATENT DOCUMENTS

EP 0552697 A2 7/1993

OTHER PUBLICATIONS

Preliminary Search Report dated Mar. 11, 2002 for French Application No. 0106141.

* cited by examiner

Primary Examiner—Hoai Pham
Assistant Examiner—Nathan W. Ha
(74) Attorney, Agent, or Firm—Lisa K. Jorgenson; Jon A. Gibbons; Fleit, Kain, Gibbons, Gutman, Bongini & Bianco P.L.

(57) ABSTRACT

The transistor includes an emitter region 17 disposed in a first isolating well 11, 150 formed in a semiconductor bulk. An extrinsic collector region 16 is disposed in a second isolating well 3, 150 formed in the semiconductor bulk SB and separated laterally from the first well by a bulk separator area 20. An intrinsic collector region is situated in the bulk separator area 20 in contact with the extrinsic collector region. An intrinsic base region 100 is formed which is thinner laterally than vertically and in contact with the intrinsic collector region and in contact with the emitter region through bearing on a vertical flank of the first isolating well facing a vertical flank of the second isolating well. An extrinsic base region 60 is formed which is substantially perpendicular to the intrinsic base region in the top part of the bulk separator area, and contact terminals C, B, E respectively in contact with the extrinsic collector region, the extrinsic base region, and the emitter region.

12 Claims, 7 Drawing Sheets

LATERAL OPERATION BIPOLAR TRANSISTOR AND A CORRESPONDING FABRICATION PROCESS

CROSS REFERENCE TO RELATED APPLICATIONS

This application is based upon and claims priority from prior French Patent Application No. 0106141, filed May 9, 2001, the disclosure of which is hereby incorporated by reference in its entirety.

BACKGROUND OF THE INVENTION

1. Field of the Invention

The present invention relates to integrated circuits and more particularly to lateral operation bipolar transistors.

2. Description of Related Art

Bipolar transistors are used to obtain higher output currents than MOS transistors. At present bipolar transistors have a vertical structure, generally including a buried extrinsic collector layer on top of which is an intrinsic collector region formed in the semiconductor bulk (substrate). On top of the intrinsic collector region is a base region covered with an emitter block.

Apart from the fact that these vertical structure, vertical operation bipolar transistors have a collector/bulk capacitance and a buried collector layer giving rise to isolation constraints, to increase the output current it is necessary to increase the width of the intrinsic base, i.e. to increase the overall surface area of the transistor. This gives rise to a problem in terms of integration density.

Accordingly, a need exists to provide a bipolar transistor and integrated circuit with a higher output current without increasing the overall surface area of the transistor so as to permit higher density integration.

SUMMARY OF THE INVENTION

Briefly in accordance with the present invention, a bipolar transistor structure is disclosed. The transistor structure provides that increasing the output transistor current does not increase its overall surface area.

The present invention provides a bipolar transistor structure having no buried collector and an extremely low, or even zero, collector/bulk capacitance.

In the present invention, a lateral operation bipolar transistor comprising:

an emitter region disposed in a first isolating well formed in a semiconductor bulk;

an extrinsic collector region disposed in a second isolating well formed in the semiconductor bulk and separated laterally from the first well by a bulk separator area;

an intrinsic collector region situated in the bulk separator area in contact with the extrinsic collector region;

an intrinsic base region, thinner laterally than vertically, in contact with the intrinsic collector region and in contact with the emitter region through bearing on the vertical flank of the first isolating well facing a vertical flank of the second isolating well;

an extrinsic base region substantially perpendicular to the intrinsic base region in the top part of the bulk separator area; and contact terminals respectively in contact with the extrinsic collector region, the extrinsic base region, and the emitter region.

The operation of the transistor is lateral operation in the sense that the current flows horizontally (laterally) between the emitter, the intrinsic base and the intrinsic collector. In contrast, the transistor according to the present invention has nothing in common from the structural point of view with conventional lateral transistors that include a collector region and an emitter region both of which are buried in a semiconductor region forming the base. In the transistor according to the present invention, the active base, i.e. the intrinsic base, is a fine vertical layer between the intrinsic collector and the emitter. In fact, the transistor according to the present invention has an intrinsic collector-intrinsic base-emitter stack that is not vertical, as in vertical operation, vertical structure transistors, but horizontal (lateral).

The height of the intrinsic base determines the transistor output current. Consequently, to obtain a higher output current, it is necessary to provide a higher intrinsic base, which does not modify the overall surface area of the transistor.

Furthermore, the transistor has no buried collector layer and disposing the extrinsic collector in an isolating well minimizes, or even eliminates, the collector/bulk capacitance.

Although the intrinsic base can be an implanted silicon base, it is particularly advantageous for the intrinsic base region to consist of a silicon-germanium alloy, especially to improve the performance of the transistor, in particular in terms of speed.

In one embodiment of the present invention, the ratio between the (vertical) height and the (lateral) thickness of the intrinsic base is not less than five to one and preferably not less than approximately ten to one.

Accordingly, the thickness of the intrinsic base can be of the order of 50 nm, for example. The height of the intrinsic base can be of the order of 500 nm. The thickness of the intrinsic collector can be of the order of 500 nm, for example. This thickness can be greater, for example of the order of 1 micron, especially if a "deep trench" isolation technique is used. The thickness of the intrinsic collector, i.e. the thickness of the bulk separator area, can be adjusted as a function of the required supply voltages. Accordingly, the wider this bulk separator area (bulk pillar), the higher the breakdown voltage and the higher the transistor supply voltage.

The present invention also provides an integrated circuit including at least one transistor as defined hereinabove.

The present invention further provides a method of fabricating a lateral operation bipolar transistor, comprising:

forming in a semiconductor bulk a separator area incorporating the intrinsic collector region of the transistor;

forming an extrinsic base region in the top part of the bulk separator area;

forming an intrinsic base region, thinner laterally than vertically, in contact with the intrinsic collector region and substantially perpendicular to the extrinsic base region;

forming in the semiconductor bulk a first isolating well on one side of the bulk separator area, the well including a first cavity opening onto the intrinsic base region at the level of a first vertical flank of the well;

forming in the semiconductor bulk on the other side of the bulk separator area a second isolating well including a second cavity opening onto the bulk separator area at the level of a second vertical flank of the well facing the first vertical flank;

filling the first and second cavities with a semiconductor material to form, respectively, an emitter region in contact with the intrinsic base region and an extrinsic collector region in contact with the intrinsic collector region; and forming contact terminals respectively in contact with the extrinsic collector region, the extrinsic base region, and the emitter region.

In one embodiment of the present invention, the process of forming each isolating well includes:

forming in the bulk an isolation area adjacent the bulk separator area, for example using a shallow trench isolation technique or using a deep trench technique;

etching the top part of the isolation area to form a top cavity;

forming isolation spacers, for example of silicon nitride, at the edges of the top cavity and in contact with the extrinsic base region; and etching the bottom part of the isolation area in line with the top cavity to form a bottom cavity, the top and bottom cavities together forming the cavity of the isolating well opening onto the substrate separator area.

To produce a silicon-germanium alloy intrinsic base region, it is particularly advantageous to provide for:

etching the isolation area of the first isolating well to form an initial cavity uncovering the vertical flank of the bulk separator area; and epitaxially growing a layer of a silicon-germanium alloy on the vertical flank.

The initial cavity is filled with insulative material before carrying out the etching to form the top cavity of the isolation area of the first isolating well.

BRIEF DESCRIPTION OF THE DRAWINGS

The subject matter which is regarded as the present invention is particularly pointed out and distinctly claimed in the claims at the conclusion of the specification. The foregoing and other advantages and features of the present invention will become apparent on examining the detailed description of non-limiting embodiments and the accompanying drawings, in which

DETAILED DESCRIPTION OF AN EMBODIMENT

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

Figure 1:
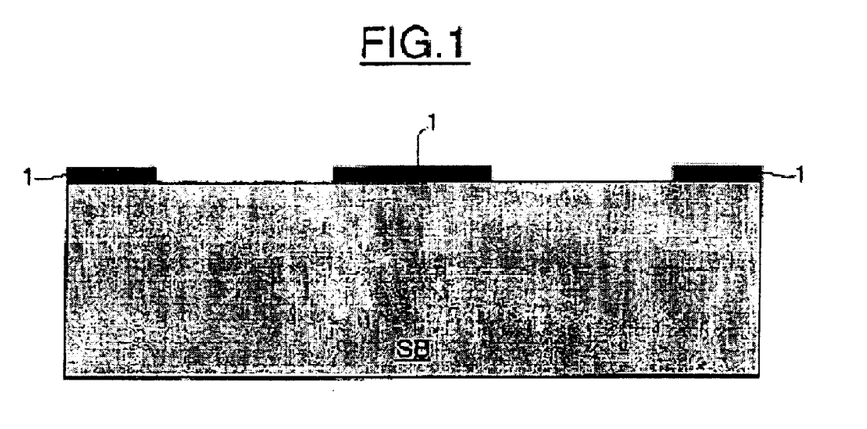
FIGS. 1 to 17 show diagrammatically the main steps of one embodiment of a process according to the present invention, producing one embodiment of a transistor according to the present invention.

FIG. 1 shows a semiconductor bulk (substrate) SB, which is N-doped, for example, within which an NPN bipolar transistor according to the present invention is to be produced.

A mask 1, for example of silicon nitride, typically having a thickness from 50 to 400 Å, is formed on the top surface of the bulk SB in a conventional manner known in the art. The silicon nitride mask 1 defines the locations of the future isolating well in which the extrinsic collector and the emitter of the transistor will be formed.

Figure 2:
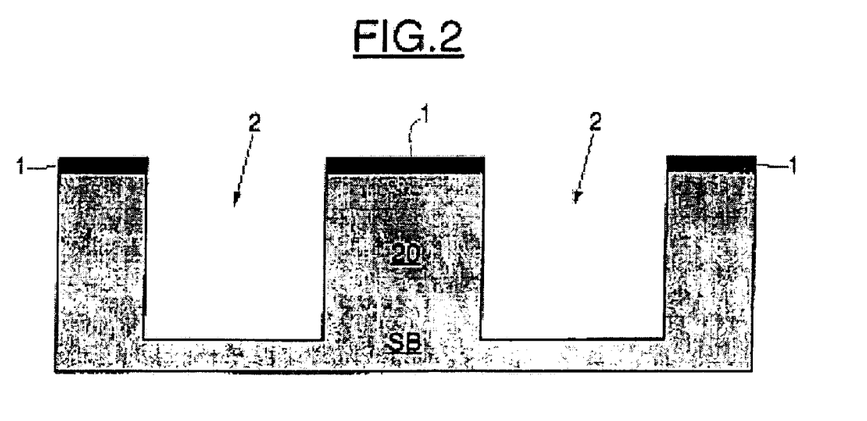

The next step (FIG. 2) is to etch the silicon of the bulk SB to form two cavities 2 separated from each other by a silicon pillar 20, also referred to as the bulk separator area.

Figure 3:
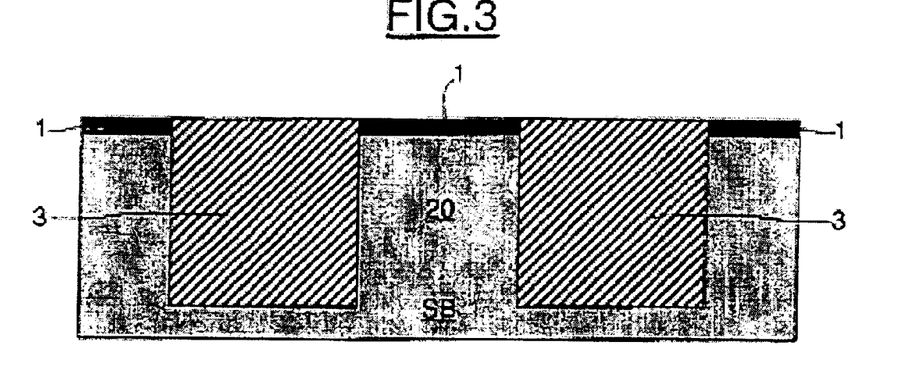

The cavities 2 are then filled in with an insulative material, for example silicon dioxide, to form two isolation areas 3 adjacent the separator area 20. The isolation areas 3 are formed in a conventional way known in the art, equivalent to forming shallow trench isolation areas. To be more precise, silicon dioxide is deposited in the cavities 2, followed by mechanical-chemical polishing to obtain the structure shown in FIG. 3.

Figure 4:
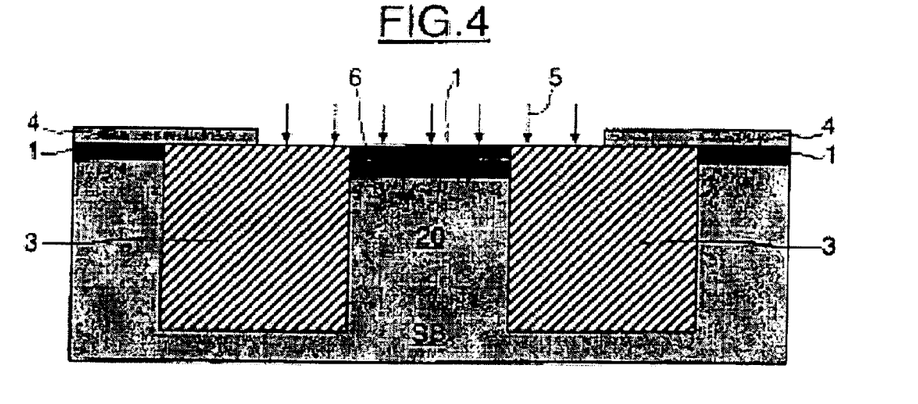

After defining an implantation mask 4 (FIG. 4) in a conventional manner known in the art, dopants 5, for example boron, are implanted to form a P$^+$-doped layer 6 in the top part of the separator area 20. This layer 6 will form the future extrinsic base of the bipolar transistor. It should be noted here that the opening in the mask does not need to be particularly accurate, provided that it extends outside the pillar 20.

Figure 5:
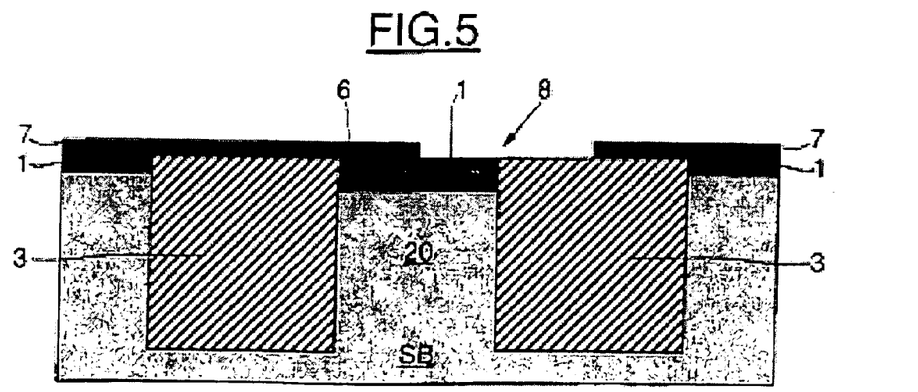
Figure 6:
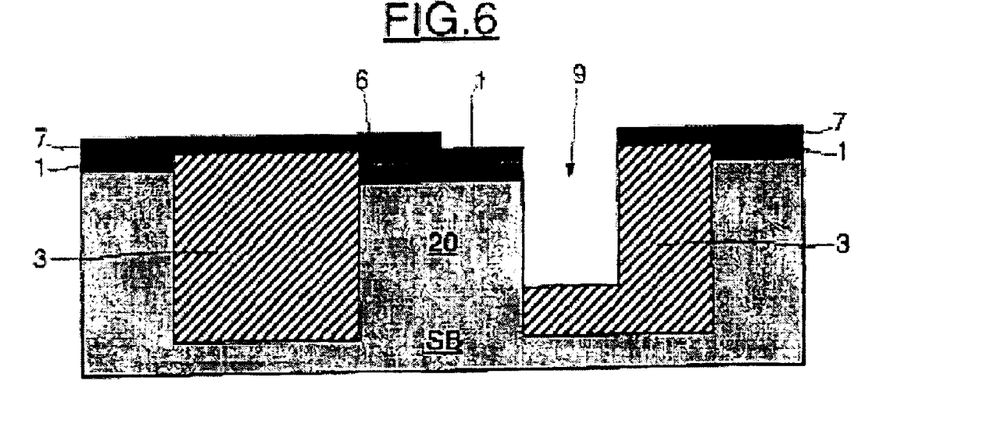
Figure 7:
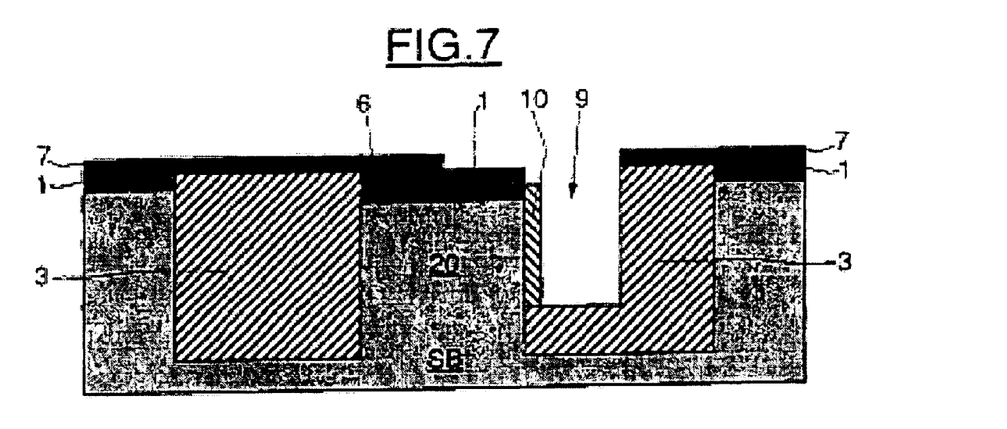

The next step (FIG. 5) is to deposit another mask layer 7 for initial etching of the isolation area 3 situated on the righthand side in FIG. 5. Once again, the opening in the mask 7 does not need to be very accurate.

When the mask 7 has been formed, initial anisotropic etching of the isolation area 3 in a conventional manner known in the art forms an initial cavity 9 uncovering the righthand vertical flank of the bulk separator area 20. The depth of the initial etching conditions the height of the future intrinsic base of the transistor and consequently the output current. In other words, the higher the required output current, the deeper the initial etching, i.e. the deeper the initial cavity 9.

To produce a silicon-germanium intrinsic base, the next step is selective epitaxial growth, by a conventional process known in the art, of a stack of layers 10, including a silicon-germanium alloy layer between two layers of silicon, on the uncovered righthand vertical flank of the bulk pillar 20, to form the intrinsic base 10.

The silicon-germanium alloy is P-doped in situ, for example.

It must be noted here that forming a silicon-germanium intrinsic base has advantages in terms of the performance of the bipolar transistor, but it would nevertheless be possible, in some applications, to produce a silicon intrinsic base, for example by oblique implantation of P-type dopants on the uncovered righthand vertical flank of the bulk pillar 20.

Figure 8:
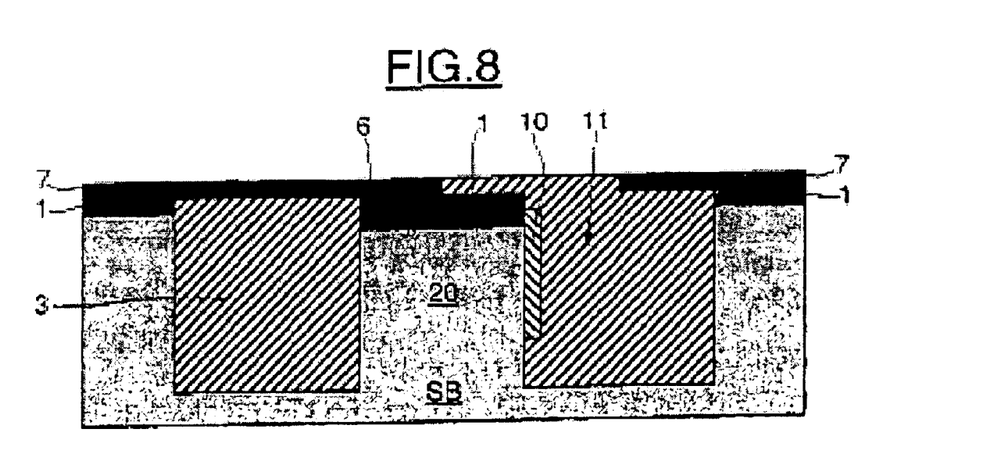

The next step (FIG. 8) entails filling the initial cavity 9 with insulative material, for example silicon dioxide, to obtain the isolation area 11 shown in FIG. 8. This filling with silicon oxide is carried out by a conventional process known in the art and is followed by mechanical-chemical polishing.

Figure 9:
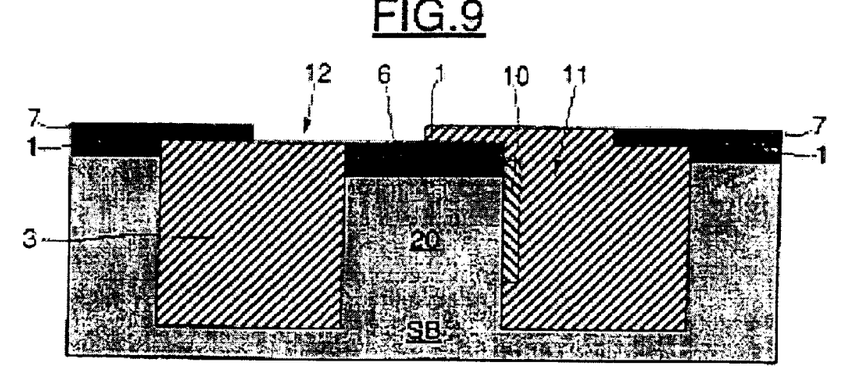

The next step (FIG. 9) is to etch the silicon nitride mask 7 in the lefthand part of FIG. 8 to define an opening 12 above the isolation area 3. Once again, the opening does not need to be very accurate.

The next step (FIG. 10) is to etch the silicon dioxide using the silicon nitride mask 7 to produce two top cavities 13 and 14 in the isolation areas 3 and 11.

Figure 10:
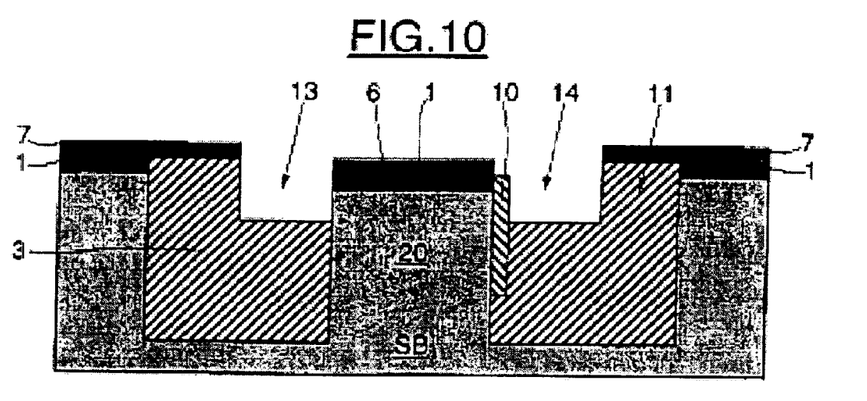
Figure 11:
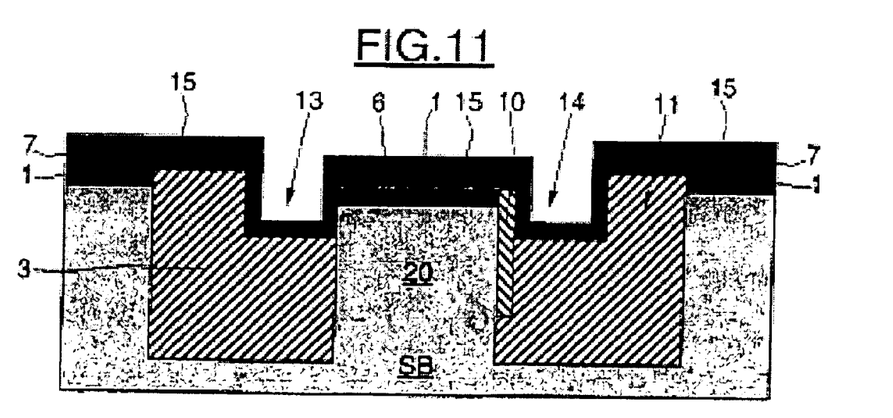
Figure 12:
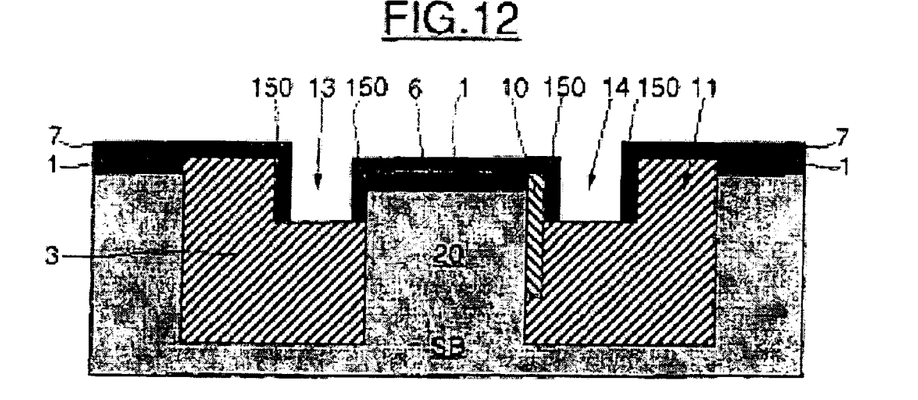

This is followed by conformal deposition of another layer 15 of silicon nitride (with a thickness of the order of one to a few hundreds of angstrom units, for example) on the FIG. 10 structure, after which (FIG. 12) time-controlled anisotropic etching of the layer 15 produces isolation spacers 150 on the vertical flanks of the top cavities 13 and 14.

The next step (FIG. 13) is further etching of the isolation area 3 and the isolation area 11 in line with the top cavities 13 and 14 to form bottom cavities 130 and 140. This etching, which is conventional in itself, is principally anisotropic but slightly isotropic. The bottom cavity 130 opens onto the lefthand vertical flank of the bulk separator pillar 20 and the bottom cavity 140 opens onto the intrinsic base 10.

Figure 13:
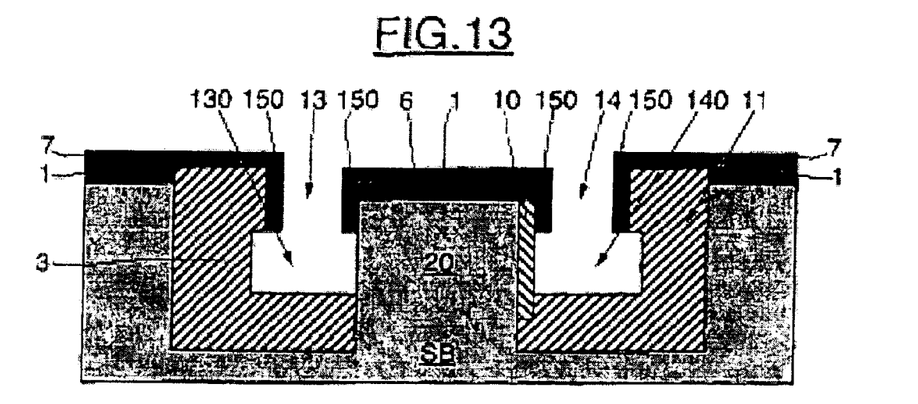

The isolation area 11 and the spacers 150 form a first isolating well including a cavity opening onto the intrinsic base 10 of the transistor and formed by the top cavity 14 and the bottom cavity 140.

Also, the isolation area 3 and the isolation spacers 150 form a second isolating well, also including a cavity opening on to the vertical flank of the bulk separator pillar 20 facing the vertical flank on which the intrinsic base 10 bears. The aforementioned cavity of the second isolating well is formed by the top cavity 13 and the bottom cavity 130.

Figure 14:
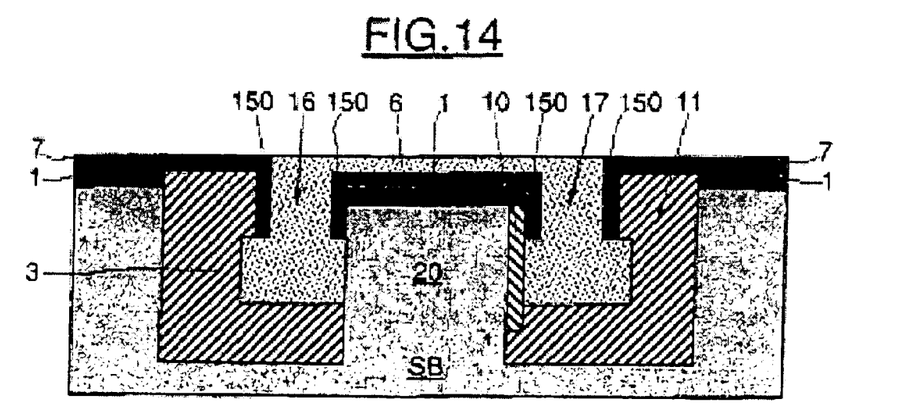

The next step (FIG. 14) is to fill the cavities with a semiconductor material, for example N-doped polysilicon 16 and 17. This is followed by mechanical-chemical polishing.

Figure 15:
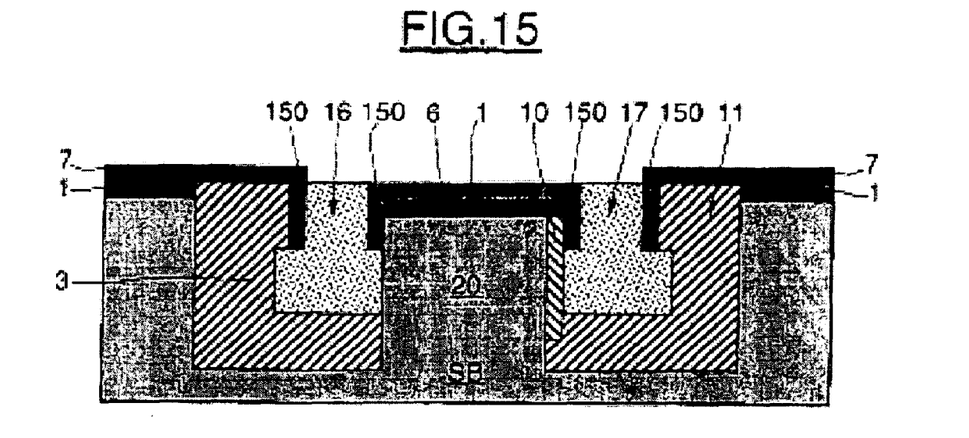
Figure 16:
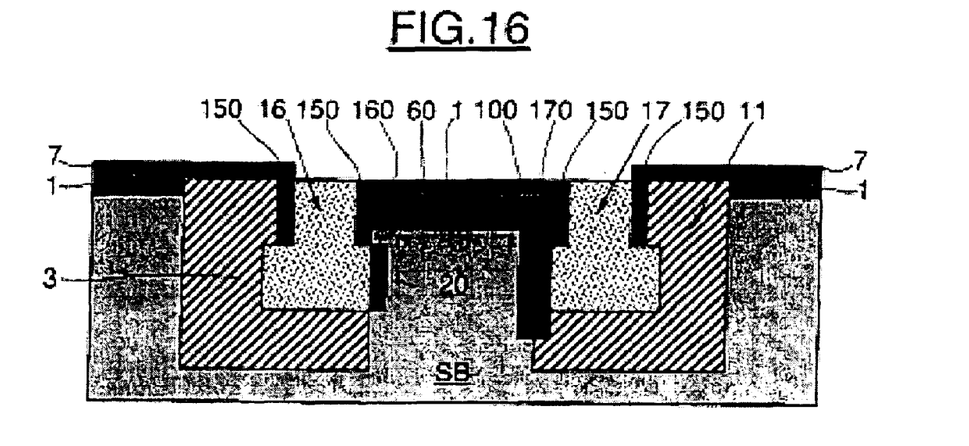

The next step (FIG. 15) is to etch the polysilicon 16 and 17, and is followed by conventional annealing (FIG. 16) to cause diffusion of the dopants. To be more precise, this yields a wider extrinsic base 60, a wider intrinsic base 100, and a diffused area 160 in the bulk pillar 20 arising from the extrinsic collector of the transistor formed by the material 16. Similarly, a diffused area 170 is obtained from the emitter region 17 of the transistor.

Figure 17:
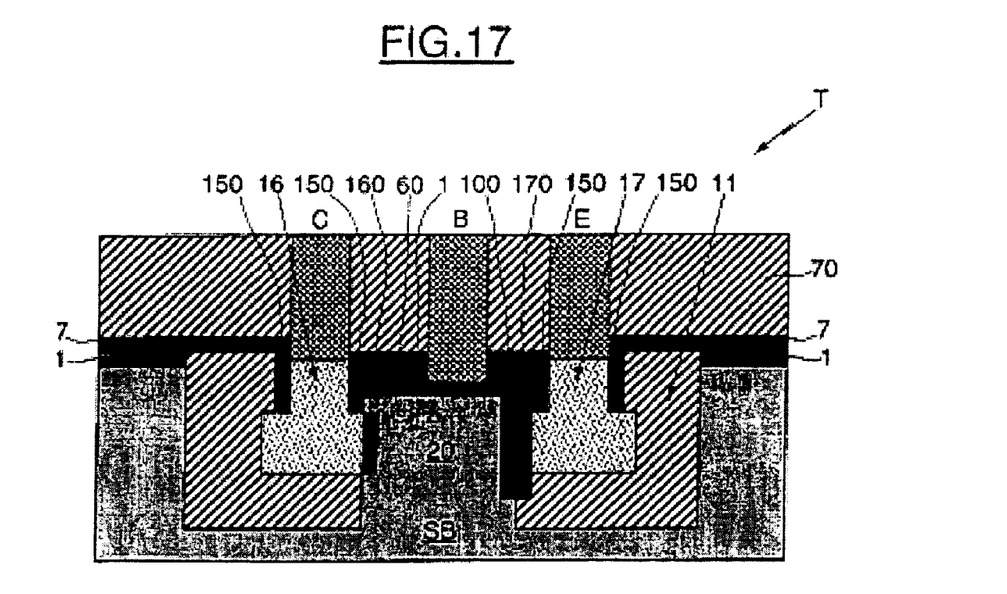

The next step, shown in FIG. 17, is to form metal (for example tungsten) contact studs C, B and E, within an insulative surface layer 70 and respectively in contact with the extrinsic collector 16, the extrinsic base 60 and the emitter 17.

The transistor T according to the present invention, as shown in FIG. 17, is therefore a lateral operation bipolar transistor including an emitter region 17 disposed in a first isolating well consisting of the areas 11 and 150.

The transistor also has an extrinsic collector region 16 disposed in a second isolating well consisting of the areas 3 and 150.

The two isolating wells are separated laterally by the bulk separator area 20, including the intrinsic collector region, which is in contact both with the extrinsic collector region and with the intrinsic base 100.

The intrinsic base 100, thinner laterally than vertically, is in contact with the emitter region through bearing on the vertical flank of the first isolating well.

The transistor further includes an extrinsic base region 60 substantially perpendicular to the intrinsic base region 100 in the top part of the bulk separator area 20. It must be noted here that the extrinsic base region is electrically isolated from the extrinsic collector region 16 and from the emitter region 17 by the isolation spacers 150.

The transistor according to the present invention is consequently noteworthy in that it has no buried collector layer. It has a virtually zero collector/bulk capacitance. Finally, it offers the facility to increase the output current simply by increasing the depth of the etching that uncovers one of the vertical flanks of the bulk pillar 20.

Of course, the present invention can also be used to produce a PNP transistor, subject to modifying the types of conductivity of certain layers, as will be evident to the person skilled in the art.

Also, deep trenches (with a depth of the order of 3 to 4 mm) can be used instead of shallow trenches to form the isolation areas 3. This gives more latitude for the operation of etching the initial cavity 9.

Although a specific embodiment of the present invention has been disclosed, it will be understood by those having skill in the art that changes can be made to this specific embodiment without departing from the spirit and scope of the present invention. The scope of the present invention is not to be restricted, therefore, to the specific embodiment, and it is intended that the appended claims cover any and all such applications, modifications, and embodiments within the scope of the present invention.

What is claimed is:

1. A lateral operation bipolar transistor, comprising:
   an emitter region disposed in a first isolating well formed in a semiconductor bulk;
   an extrinsic collector region disposed in a second isolating well formed in the semiconductor bulk and separated laterally from the first well by a bulk separator area;
   an intrinsic collector region situated in the bulk separator area in contact with the extrinsic collector region;
   an intrinsic base region formed to be thinner laterally than vertically and formed to be in contact with the intrinsic collector region and in contact with the emitter region through bearing on a vertical flank of the first isolating well facing a vertical flank of the second isolating well; and
   an extrinsic base region formed in a top part of the bulk separator area so as to be substantially perpendicular to the intrinsic base region.

2. The lateral operation bipolar transistor of claim 1, further comprising:
   a plurality of contact terminals in contact with at least one of the extrinsic collector region, the extrinsic base region, and the emitter region.

3. The lateral operation bipolar transistor of claim 1, wherein the intrinsic base region consists of a silicon-germanium allay.

4. The lateral operation bipolar transistor of claim 1, wherein the intrinsic base region is formed with a ratio of a height to a thickness of not less than five to one.

5. The lateral operation bipolar transistor of claim 1, wherein the intrinsic base region is formed with a ratio of a height to a thickness of not less than ten to one.

6. The lateral operation bipolar transistor of claim 4, wherein the intrinsic base region is formed with a height of 500 nanometer and a thickness of 50 nanometer and the thickness of the instrinsic collector is 1 micron.

7. An integrated circuit comprising:
   one or more transistors;
   at least one lateral operation bipolar transistor, comprising:
      an emitter region disposed in a first isolating well formed in a semiconductor bulk;
      an extrinsic collector region disposed in a second isolating well formed in the semiconductor bulk and separated laterally from the first well by a bulk separator area;
      an intrinsic collector region situated in the bulk separator area in contact with the extrinsic collector region;
      an intrinsic base region formed to be thinner laterally than vertically and formed to be in contact with the intrinsic collector region and in contact with the emitter region through bearing on a vertical flank of the first isolating well facing a vertical flank of the second isolating well; and
      an extilnaic base region formed in a top part of the bulk separator area so as to be substantially perpendicular to the intrinsic base region.

8. The Integrated circuit of claim 7, further comprising:
a plurality of contact terminals respectively in contact with at least one of the extrinsic collector region, the extrinsic base region, and the emitter region.

9. The integrated circuit of claim 7, wherein the intrinsic base region consists of a silicon-germanium alloy.

10. The integrated circuit of claim 7, wherein the intrinsic base region is formed with a ratio of a height to a thickness of not less than five to one.

11. The integrated circuit of claim 7, wherein intrinsic base region is formed with a ratio of a height to a thickness of not less than ten to one.

12. The Integrated circuit of claim 10, wherein the intrinsic base region Is formed with a height of 500 nanometer and a thickness of 50 nanometer and the thickness of the intrinsic collector is 1 micron.

* * * * *

UNITED STATES PATENT AND TRADEMARK OFFICE
CERTIFICATE OF CORRECTION

PATENT NO. : 6,897,545 B2
DATED : May 24, 2005
INVENTOR(S) : Olivier Menut et al.

It is certified that error appears in the above-identified patent and that said Letters Patent is hereby corrected as shown below:

Column 6,
Line 35, change "allay" to -- alloy --;
Line 65, change "extilnaic" to -- extrinsic --; and Column 8,
Line 5, change "Is" to -- is --

Signed and Sealed this

Ninth Day of August, 2005

JON W. DUDAS
*Director of the United States Patent and Trademark Office*